US007840858B2

(12) United States Patent
Fujibe

(10) Patent No.: US 7,840,858 B2
(45) Date of Patent: Nov. 23, 2010

(54) DETECTION APPARATUS AND TEST APPARATUS

(75) Inventor: Tasuku Fujibe, Tokyo (JP)

(73) Assignee: Advantest Corporation (JP)

( * ) Notice: Subject to any disclaimer, the term of this patent is extended or adjusted under 35 U.S.C. 154(b) by 272 days.

(21) Appl. No.: 11/857,448

(22) Filed: Sep. 19, 2007

(65) Prior Publication Data

US 2009/0006025 A1 Jan. 1, 2009

Related U.S. Application Data

(63) Continuation of application No. PCT/JP2007/062925, filed on Jun. 27, 2007.

(51) Int. Cl.
*G11B 5/00* (2006.01)
*G01R 31/28* (2006.01)
(52) U.S. Cl. ........................ 714/700; 714/744
(58) Field of Classification Search ................ 714/724, 714/736, 744, 718, 719, 738, 731, 742, 743, 714/734; 324/765; 365/201
See application file for complete search history.

(56) References Cited

U.S. PATENT DOCUMENTS

| | | | | |
|---|---|---|---|---|
| 6,182,233 B1 * | 1/2001 | Schuster et al. | ............. | 713/400 |
| 6,377,065 B1 * | 4/2002 | Le et al. | ............. | 324/765 |
| 6,477,674 B1 * | 11/2002 | Bates et al. | ............. | 714/738 |
| 6,479,983 B1 * | 11/2002 | Ebiya | ............. | 324/158.1 |
| 6,549,000 B2 * | 4/2003 | Ebiya | ............. | 324/158.1 |
| 6,629,274 B1 * | 9/2003 | Tripp et al. | ............. | 714/721 |
| 6,696,862 B2 * | 2/2004 | Choi et al. | ............. | 326/93 |
| 6,715,096 B2 * | 3/2004 | Kuge | ............. | 713/600 |
| 6,990,613 B2 * | 1/2006 | Doi et al. | ............. | 714/700 |
| 7,002,334 B2 * | 2/2006 | Tanaka et al. | ............. | 324/76.11 |
| 7,010,729 B2 * | 3/2006 | Doi et al. | ............. | 714/700 |
| 7,038,953 B2 * | 5/2006 | Aoki | ............. | 365/189.05 |
| 7,406,646 B2 * | 7/2008 | Sato et al. | ............. | 714/744 |
| 7,461,316 B2 * | 12/2008 | Hasegawa et al. | ............. | 714/744 |
| 2004/0208048 A1 * | 10/2004 | Doi et al. | ............. | 365/145 |

FOREIGN PATENT DOCUMENTS

| | | |
|---|---|---|
| JP | 07-244078 | 9/1995 |
| JP | 2001-153933 | 6/2001 |
| JP | 2004-125552 | 4/2004 |
| JP | 2004-127455 | 4/2004 |
| JP | 2004-325332 | 11/2004 |
| WO | 02103379 | 12/2002 |

* cited by examiner

*Primary Examiner*—Jeffrey A Gaffin
*Assistant Examiner*—Daniel F McMahon
(74) *Attorney, Agent, or Firm*—Chen Yoshimura LLP

(57) ABSTRACT

A detection apparatus is provided. The detection apparatus includes; a multi-strobe generating section that generates a plurality of strobe signals with phases different from one another; a plurality of acquiring sections each of which acquires a signal value of a signal under measurement at a timing of each of the plurality of strobe signals; a plurality of changing point detecting sections that detect a fact that there is a changing point of the signal under measurement between two adjacent strobe signals when two signal values which are acquired in accordance with the two adjacent strobe signals are different from one another; a mask setting section that sets the changing point detecting section to be enabled among the plurality of changing point detecting sections; and a changing timing output section that outputs a changing timing of the signal under measurement based on an output of the enabled changing point detecting section.

14 Claims, 12 Drawing Sheets

FIG. 3A   DUT OUTPUT 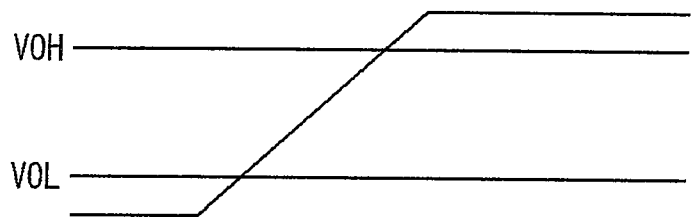
FIG. 3B   STRB 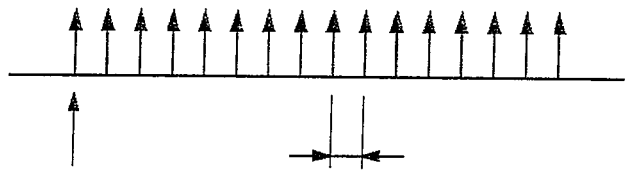

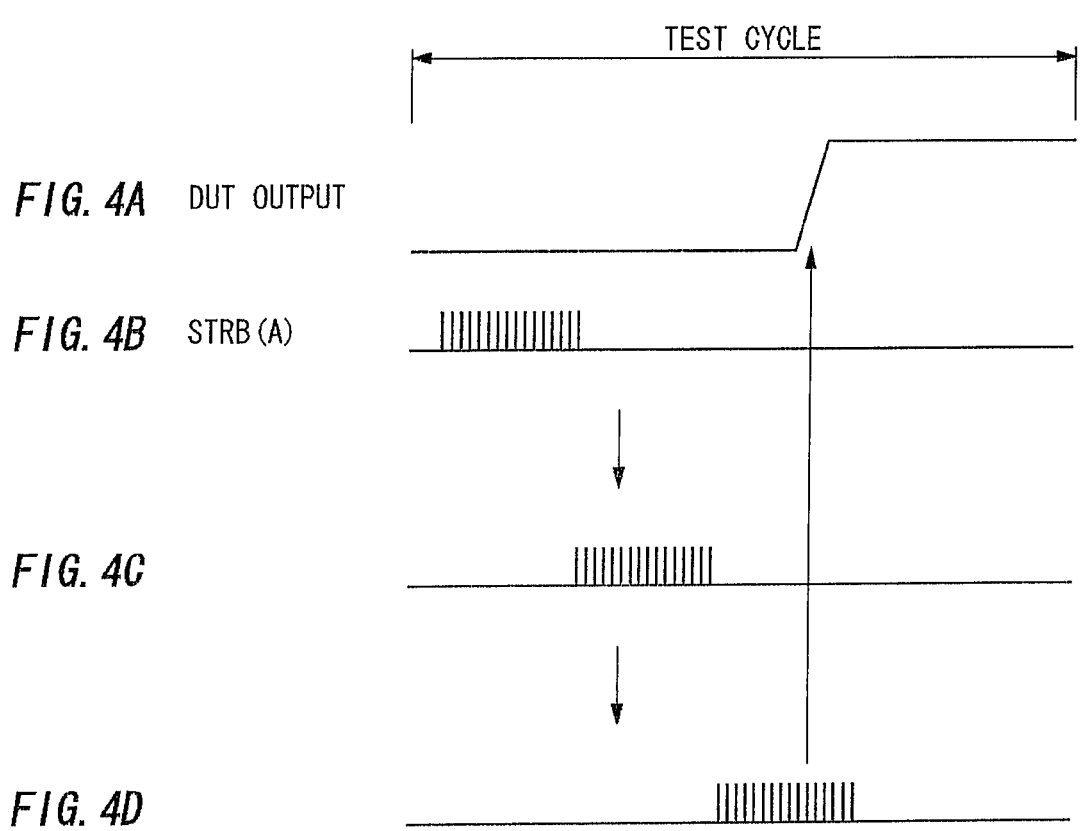

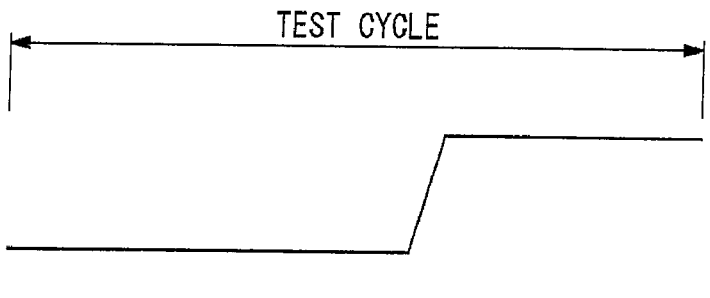
FIG. 5A  DUT OUTPUT
FIG. 5B  STRB(B)

FIG. 6A  DUT OUTPUT (LARGE JITTER)  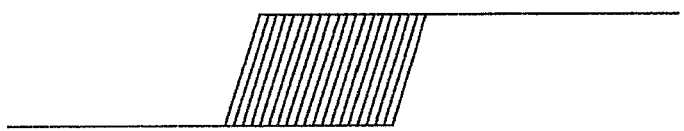
FIG. 6B  STRB(A)
FIG. 6C  DUT OUTPUT  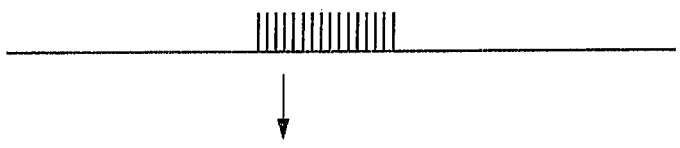
FIG. 6D  STRB(A)
FIG. 6E  DUT OUTPUT  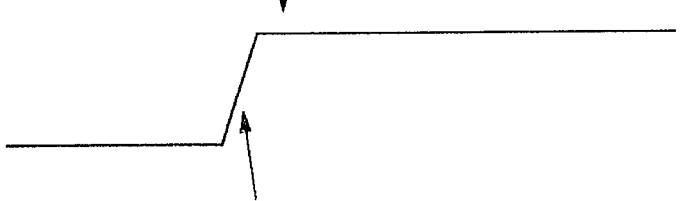
FIG. 6F  STRB(B)  

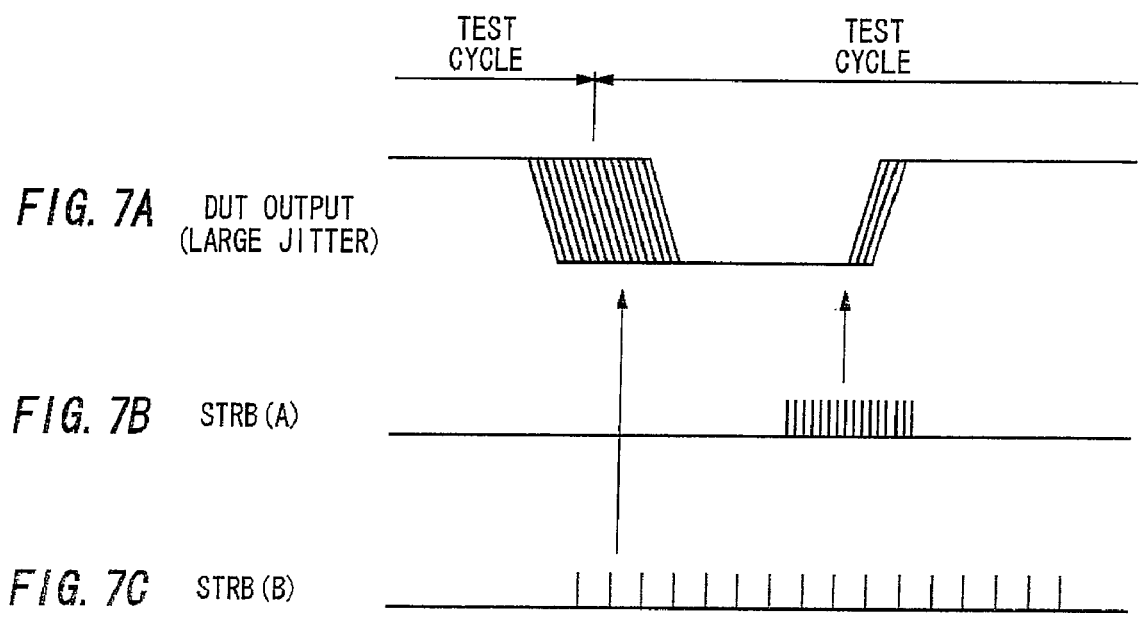
FIG. 7A DUT OUTPUT (LARGE JITTER)
FIG. 7B STRB (A)
FIG. 7C STRB (B)

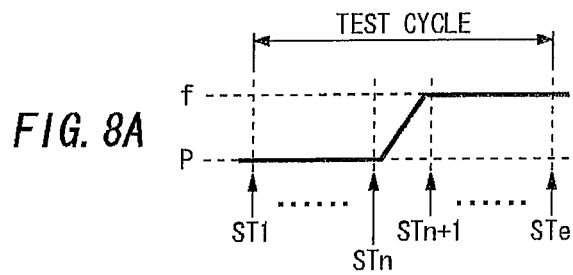
FIG. 8A
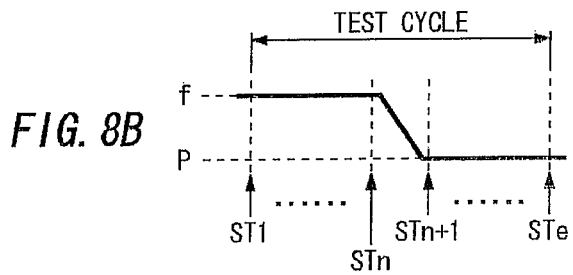
FIG. 8B
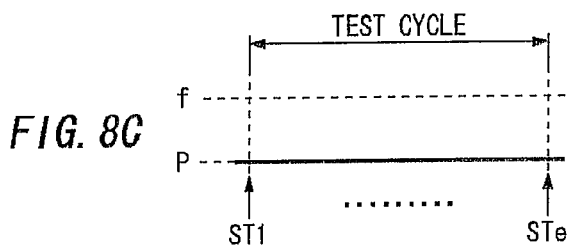
FIG. 8C
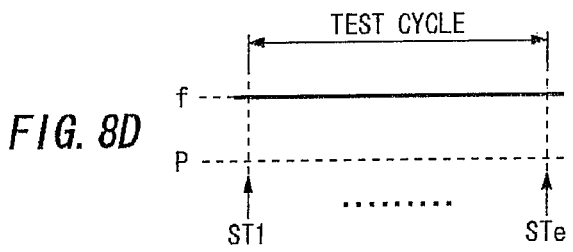
FIG. 8D
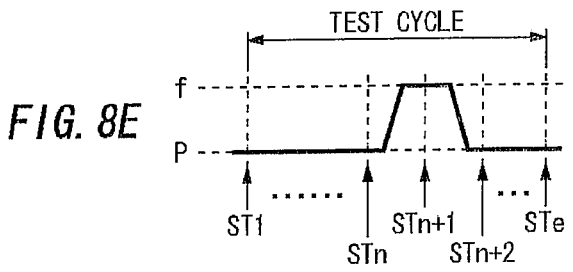
FIG. 8E
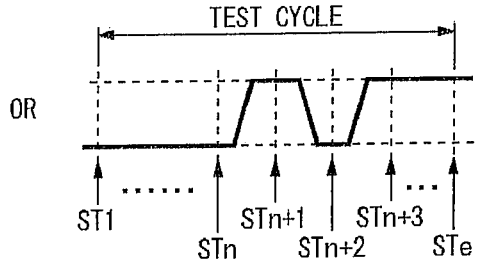
OR
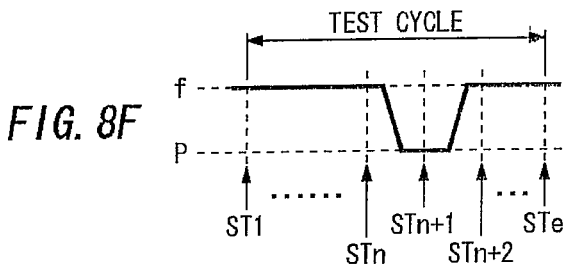
FIG. 8F
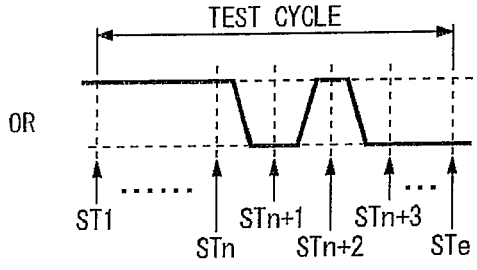
OR

DETECTION APPARATUS AND TEST APPARATUS

CROSS REFERENCE TO RELATED APPLICATION

This is a continuation application of PCT/JP2007/62925 filed on Jun. 27, 2007, the contents of which are incorporated herein by reference.

BACKGROUND

1. Technical Field

The present invention relates to a detection apparatus and a test apparatus. Particularly, the present invention relates to a detection apparatus that detects a changing point of a signal value of a signal under measurement, and a test apparatus.

2. Related Art

Generally, a test apparatus having a multi-strobe function has been disclosed as, for example, in Japanese Patent Application Publication No. 2004-127455. Such test apparatus acquires a signal-under measurement outputted from a device under test such as a semiconductor device by each of a plurality of strobe signals (a multi-strobe signal) whose phases are different from one another by bits to detect a changing timing of the signal under measurement based on the acquired result.

Since a test cycle period covered by a set of multi-strobe signal is limited in such test apparatus, sometimes it has not been known where a changing point of a value of the signal under measurement is located in a wide test cycle period. In this case, the test apparatus extends an interval between the phase of each strobe signal of a multi-strobe signal, for example to extend the period for a set of multi-strobe signal covering the test cycle period, so that the changing point can be detected. However, if the covering period of the multi-strobe signal is extended, any incorrect changing point other than the changing point to be detected could be detected when there are a plurality of changing points of the value of the signal under measurement in a test cycle period, for example.

SUMMARY

Therefore, it is an object of an aspect of the present invention to provide a detection apparatus and a test apparatus, which are capable of overcoming the above drawbacks accompanying the related art. The above and other objects can be achieved by combinations described in the independent claims. The dependent claims define further advantageous and exemplary combinations of the present invention.

According to a first aspect related to the innovations herein, one exemplary detection apparatus is provided. The detection apparatus includes: a multi-strobe generating section that generates a plurality of strobe signals with phases different from one another; a plurality of acquiring sections each of which acquires a signal value of a signal under measurement at a tinting of each of the plurality of strobe signals; a plurality of changing point detecting sections each of whish detects a fact that there is a changing point between two adjacent strobe signals when two signal values acquired in accordance with the two strobe signals are different from one another; a mask setting section that sets the changing point detecting sections to be enabled among the plurality of changing point detecting sections; and a changing timing output section that outputs a changing timing of the signal under measurement based on an output of the enabled changing point detecting section.

According to a second aspect related to the innovations herein, one exemplary test apparatus that tests devices under test is provided. The test apparatus includes: a test signal supply section that supplies test signals to the devices under test; and a judgment section that judges pass/fail of the device under test based on the signal under measurement outputted by the device under test in accordance with the test signal. The judgment section includes: a multi-strobe generating section that generates a plurality of strobe signals with phases different from one another; a plurality of acquiring sections each of which acquires a signal value of a signal under measurement at a timing of each of the plurality of strobe signals; a plurality of changing point detecting sections each of whish detects a fact that there is a changing point between two adjacent strobe signals when two signal values acquired in accordance with the two strobe signals are different from one another; a mask setting section that sets the changing point detecting sections to be enabled among the plurality of changing point detecting sections; a changing timing output section that outputs a changing timing of the signal under measurement based on an output of the enabled changing point detecting section; and a pass/fail judgment unit that judges pass/fail of the device under test based on the changing timing of the signal under measurement.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIGS. 3A and 3B show an exemplary relationship between a signal under measurement and strobe signals;

FIGS. 4A to 4D show an exemplary relationship between a signal under measurement and strobe signals in short intervals;

FIGS. 5A and 5B show an exemplary relationship between a signal under measurement and strobe signals in long intervals;

FIGS. 6A to 6F show an exemplary relationship between a signal under measurement with jitter and strobe signals;

FIGS. 7A to 7C show an exemplary relationship between a signal under measurement with jitter and glitch and strobe signals;

FIGS. 8A to 8F show an exemplary relationship between a signal under measurement having a changing point and strobe signals

DESCRIPTION OF EXEMPLARY EMBODIMENTS

Some aspects of the invention will now be described based on preferred embodiments, which do not intend to limit the scope of the invention, but exemplify the invention. All of the features and the combinations thereof described in the embodiments are not necessarily essential to the invention.

Figure 1:
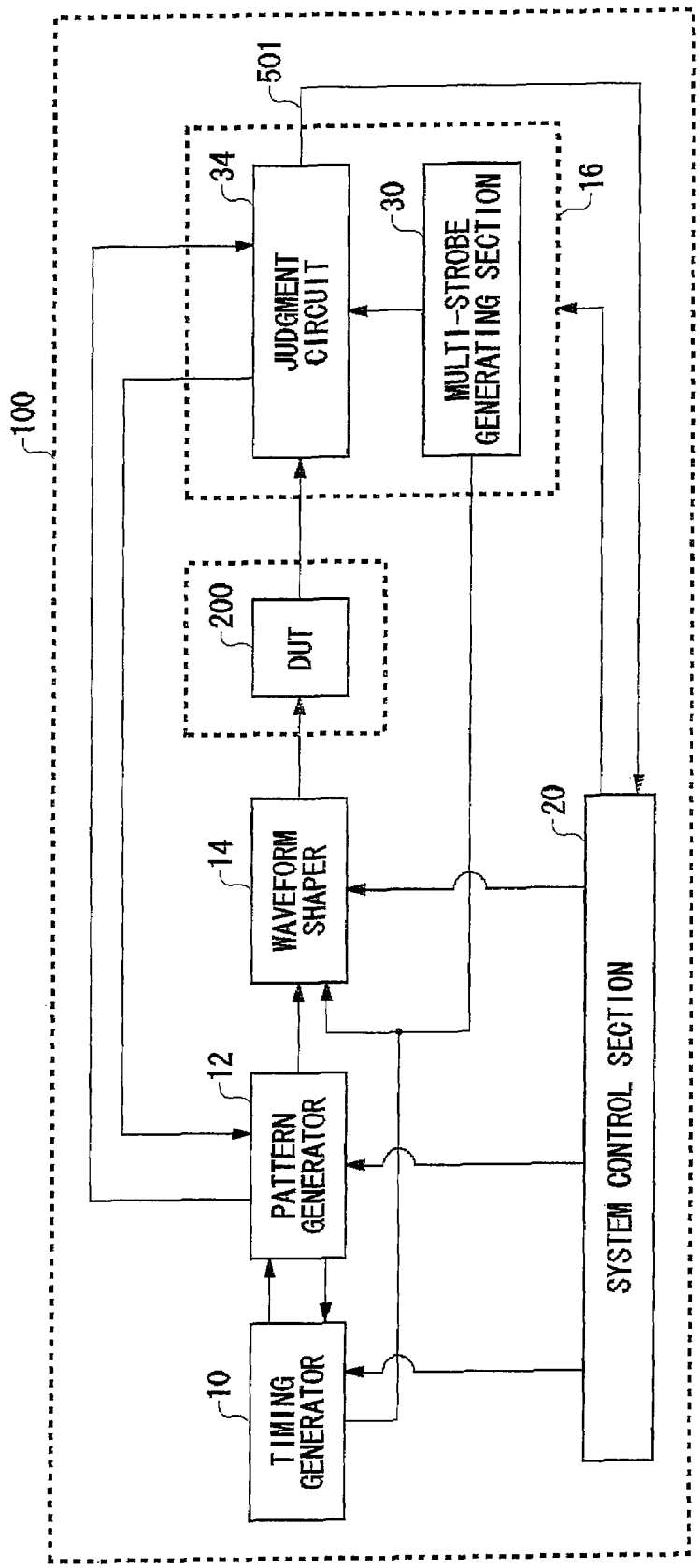
FIG. 1 shows an exemplary configuration of test apparatus 100 according to the present embodiment.

FIG. 1 shows an exemplary configuration of a test apparatus 100 according to the present embodiment. The test apparatus 100 tests devices under test 200 by detecting values of signals under measurement of devices under test (DUTs) 200 by using a multi-strobe signal having a plurality of strobe signals. The test apparatus 100 includes a test signal supply section having a timing generator 10, a pattern generator 12 and a waveform shaper 14, a judgment section 16 and a system control section 20.

The test signal supply section supplies test signals to devices under test 200. The timing generator 10 generates a timing signal to operate the test apparatus 100. For example, the timing generator 10 receives a test set signal indicative of a timing at which the pattern generator 12 supplies a test pattern to the device under test 200. In addition, the timing generator 10 supplies to the waveform shaper 14 a signal indicative of a timing at which the test pattern is supplied to the device under test 200. Moreover, the timing generator 10 supplies to the multi-strobe generating section 30 strobe signals indicative of a timings at which a multi-strobe signal is generated by a multi-strobe generating section 30. Further, the timing generator 10 generates a reference clock to synchronize an operation of the test apparatus 100 and supplies it to each component of the test apparatus 100.

The pattern generator 12 generates a test pattern for testing devices under test 200 and supplies it to the waveform shaper 14 meanwhile the pattern generator 12 outputs to the judgment circuit 34 an expected value signal which is expected to be outputted from the device under test 200 because of inputting the test pattern. The waveform shaper 14 forms a received test pattern. In addition, the waveform shaper 14 supplies a formed test pattern to the device under test 200 in accordance with a signal indicative of a timing received from the timing generator 10. The judgment section 16 judges pass/fail of the device under test 200 based on a signal under measurement outputted from the device under test 200 in accordance with the test signal (test pattern) and outputs a pass/fail judgment result signal 501. The judgment section 16 has the multi-strobe generating section 30 and the judgment circuit 34.

The multi-strobe generating section 30 generates a multi-strobe signal having a plurality of strobe signals with phases different from one another at a regular interval based on the strobe signals received from the timing generator 10. The number of phases of a multi-strobe signal is a predetermined number such as sixteen phases, thirty-two phases and so forth. In addition, the multi-strobe signal outputs sixteen or thirty-two strobe signals at a predetermined regular interval beginning at a strobe phase position designated by the timing generator 10 in a test cycle. The multi-strobe signal will be described later with reference to FIGS. 3-8. Here, for plural phases of strobe signals, interest intervals of a signal under measurement are set as fine phase intervals and intervals other than the interest intervals are set as rough phase intervals, so that the finite number of phases can be effectively utilized. Moreover, strobe signals with a plurality of phases may have desired phase intervals other than the regular intervals.

The judgment circuit 34 latches to detect a signal under measurement outputted from the device under test 200 by the multi-strobe signal having a plurality of phases at each phase timing. In addition, the judgment circuit 34 detects a changing point of a value of the signal under measurement. Meanwhile, the pattern generator 12 supplies to the judgment circuit 34 a signal which is expected to be outputted by the device under test 200 for an inputted test pattern (expected value signal). The judgment circuit 34 detects expected value information of a timing at which the value of the signal under measurement is changed (changing point) based on the expected value signal from the pattern generator 12. The judgment circuit 34, for example, compares the changing point of the expected value signal and the changing point of the signal under measurement of the device under test 200. In addition, judgment circuit 34 judges pass/fail of the device under test 200 based on whether there is any changing point of the signal under measurement of the device under test 200 within the changing point of the expected value signal and outputs a pass/fail judgment result signal 501.

The system control section 20 is a computer device described later with reference to FIG. 11, for example that controls each section in the test apparatus 100. In addition, the system control section 20 receives the pass/fail judgment result signal 501 from the judgment circuit 34, also receives a first-phase level signal 401, a changing point phase signal 402 and a glitch detection signal 403, determines a setting value for a mask setting section 330, of the phase of strobe signal to be masked and a setting value for a reference signal setting section 340 of the acquiring section that outputs a reference signal, and outputs them.

The device under test 200 may be an integrated circuit with semiconductor devices such as a DDR-SD RAM (Double Data Rate-SDRAM). The DDR-SDRAM outputs a data (DQ) signal in synchronism with raising or falling a clock (DQS) signal and reduces a condition for a timing of setup/hold at receiving/transmitting data. Such device requires a predetermined setup time and hold time between the signal under measurement and the clock in order to correctly setup/hold data. When the device under test 200 is the DDR-SDRAM, the judgment section 16 receives as output signals the signal under measurement of the DDR-SDRAM and the DQS being a clock signal outputted in synchronism with the signal under measurement. In this case, the judgment section 16 performs a setup/hold test on the device under test 200 based on the received signal under measurement and clock signal to judge pass/fail of the device under test 200. Specifically, the judgment section 16 acquires the signal under measurement and the clock signal by individual strobe signals of the multi-strobe signal, respectively and performs the setup/hold test based on the phase difference between the changing points.

Figure 2:
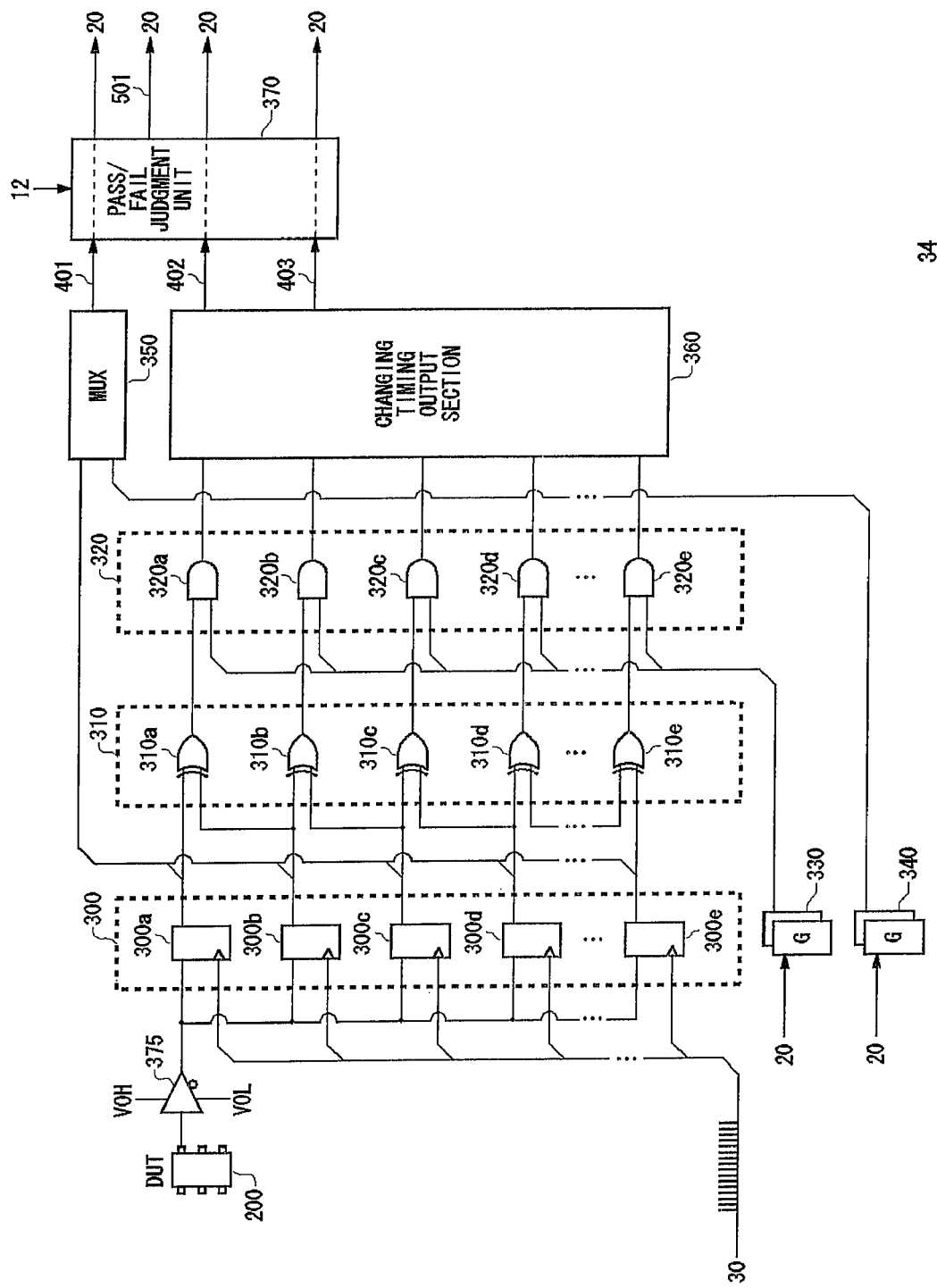
FIG. 2 shows an exemplary configuration of judgment circuit 34 according to the present embodiment.

FIG. 2 shows an exemplary configuration of the judgment circuit 34 according to the present embodiment. The judgment circuit 34 is an exemplary detection apparatus according to the present embodiment and has a level detection section 375, a plurality of acquiring sections 300a-e, a plurality of changing point detecting sections 310a-e, a plurality of changing point masking sections 320a-e, a mask setting section 330, a changing timing output section 360 and a pass/fail judgment unit 370.

The level detection section 375 receives a signal under measurement at an analog voltage outputted from the device under test 200 and outputs a logical value in accordance with a signal level. For example, the level detection section 375 outputs 1, 0 or the like which is a value different from one another dependent on whether the input voltage is higher or lower than a predetermined threshold voltage VO. In addition, the level detection section 375 has two kinds of predetermined threshold voltages such as VOH at a high potential side and VOL at a low potential side. When the input voltage changes from the low potential side to the high potential side, the level detection section 375 uses VOH at the high potential side as the predetermined threshold value voltage. Meanwhile, when the input voltage changes from the high potential side to the low potential side, the level detection section 375 may use VOL at the low potential side as the predetermined threshold value voltage.

A plurality of strobe signals are inputted from the multi-strobe generating section 30 to the plurality of acquiring sections 300a-e and each of the plurality of acquiring sections 300a-e acquires the value of the signal under measurement at a timing for each of a plurality of strobe signals. In addition, the plurality of acquiring section 300s a-e output the signal values to the behind changing point detecting section 310 and reference signal selecting section 350. Each of the plurality of acquiring sections 300a-e may be a flip flop that latches the signal under measurement by the clock as each strobe signal. The plurality of acquiring sections 300a-e include a first acquiring section 300a, a second acquiring section 300b, a third acquiring section 300c, a fourth acquiring section 300d, ... a n-th acquiring section 300e, here n is any positive integer.

An output value of the level detection section 375 and a first phase of strobe signal of a multi-strobe signal are inputted to the first acquiring section 300a, and the fist acquiring section 300a outputs an output value of the level detection section 375 detected at a timing of the first phase of strobe signal.

An output value of the level detection section 375 and a second phase of strobe signal of the multi-strobe signal are inputted to the second acquiring section 300b, and the second acquiring section 300b outputs an output value of the level detection section 375 detected at a timing of the second phase of strobe signal.

In the same way, an output value of the level detection section 375 and the corresponding phase of strobe signal of the multi-strobe signal are inputted to each of the following acquiring sections including the third acquiring section 300c, and each acquiring section outputs the output value of the level detection section 375 detected at a timing of the corresponding phase of strobe signal.

A value of each signal under measurement from the plurality of acquiring sections 300a-e is inputted to each of the plurality of changing point detecting sections 310a-e, and when two signal values acquired in accordance with two adjacent strobe signals are different from one another, the plurality of changing point detecting sections 310a-e detect that there is any changing point of the signal under measurement between the two strobe signals. Moreover, the plurality of changing point detecting sections 310a-e output the detection result to the behind changing point masking section 320. For example, each of the plurality of changing point detecting sections 310a-e may be an exclusive OR gate that inputs a signal value of each signal under measurement outputted from the corresponding acquiring section in the plurality of acquiring sections 300a-e and from the acquiring section adjacent to that acquiring section at the behind strobe signal side. The plurality of changing point detecting sections 310a-e include a first changing point detecting section 310a, a second changing point detecting section 310b, a third changing point detecting section 310c, a fourth changing point detecting section 310d, ... a n-th changing point detecting section 310e, here n is any positive integer.

An output of the first acquiring section 300a and an output of the second acquiring section 300b are inputted to the first changing point detecting section 310a, and when the values of both outputs are different from one another, the first changing point detecting section 310a outputs a changing point detection signal. That is, when the level of the signal under measurement outputted from the device under test 200 is different between the timing of the first phase of strobe signal and that of the second phase of strobe signal, the first changing point detecting section 310a outputs a changing point detection signal.

In the same way, when the level of the signal under measurement outputted from the device under test 200 is different between the timing of the second phase of strobe signal and that of the third phase of strobe signal, the second changing point detecting section 310b outputs a changing point detection signal. Moreover, each of the following changing point detecting sections including the third changing point detecting section 300c also outputs a changing point detection signal when the level of the signal under measurement outputted from the device under test 200 is different between the timing of the corresponding phase order of strobe signal and that of the next phase of strobe signal.

Each of the plurality of changing point masking sections 320a-e receives a detection result of the changing point of the signal under measurement from each of the changing point detecting sections 310a-e, outputs a detection result of the changing point detecting section 310 to be enabled to the behind changing timing output section 360 among the plurality of changing point detecting sections 310a-e according to contents of setting by the mask setting section 330 and masks an detection result of the changing point detecting section 310 to be disabled. For example, each of the plurality of changing point masking sections 320a-e may be an AND gate that receives the detection result of the changing point of the signal under measurement outputted from the corresponding changing point detecting section among the plurality of changing point detecting sections 310a-e and an output of the mask setting section 330. The plurality of changing point masking sections 320a-e include a first changing point masking section 320a, a second changing point masking section 320b, a third changing point masking section 320c, a fourth changing point masking section 320d, ... a n-th changing point masking section 320e.

An output of the first changing point detecting section 310a and an output of the mask setting section 330 are inputted to the first changing point masking section 320a. Here, the changing point of the value of the signal under measurement between a timing of the first phase of strobe signal and that of the second phase of strobe signal is detected. When the timing of the first phase of strobe signal is not to be masked, the first changing point masking section 320a outputs a changing point detection signal. Specifically, the first changing point masking section 320a receives from the mask setting section 330 a mask signal of logical value 1 when the first changing point masking section 320a does not mask an output of the first changing point detecting section 310a, and receives from the mask setting section 330 a mask signal of logical value 0 when the first changing point masking section 320a masks the output of the first changing point detecting section 310a, and then, outputs AND of the output of the first changing point detecting section 310a and the mask signal.

In the same way, an output of the second changing point detecting section 310b and an output of the mask setting section 330 are inputted to the second changing point masking section 320b. Here, the changing point of the value of the signal under measurement between a timing of the second phase of strobe signal and that of the third phase of the strobe signal is detected. When the timing of the second phase of strobe signal is not to be masked, the second changing point masking section 320*b* outputs a changing point detection signal. Moreover, an output of the corresponding order of changing point detecting section and an output of the mask setting section 330 are inputted to each of the following changing point masking sections including the third changing point masking section 320*c*. Here, a changing point of the value of the signal under measurement between a timing of the corresponding order of phase of strobe signal and the next phase of strobe signal is detected. When the timing of the corresponding order of phase of strobe signal is not to be masked, each changing point masking section outputs a changing point detection signal.

The mask setting section 330 sets any changing point detecting section 310 to be enabled among the plurality of changing point detecting sections 310*a-e*. Specifically, the mask setting section 330 has a setting register corresponding to each changing point detecting section 310.

The reference signal setting section 340 sets which of a plurality of signal values acquired by the plurality of acquiring sections 300*a-e* is a reference signal value indicative of a value before/after clanging the signal under measurement. For example, setting a reference signal value indicative of the value before changing the signal under measurement, the test apparatus 100 may set the reference signal setting section 340 such that an output of the first acquiring section 300*a* corresponding to the initial phase of the multi-strobe signal is the reference signal.

Meanwhile, setting a reference signal value indicative of the value after changing the signal under measurement, for example, the test apparatus 100 may set to the reference signal setting section 340 a signal value of the last phase of strobe signal among each signal value detected by the multi-strobe signal in the acquiring section 300. For example, when an expected value of the multi-strobe signal registered on a pattern memory of the pattern generator 12 is inverted and used, the reference signal setting section 340 may set a signal value of the last phase of strobe signal as the reference signal value instead of setting a signal value of the first phase of strobe signal as the reference signal value. Thereby the reference signal setting section 340 can invert the expected value of a test pattern without changing data of the test pattern in the pattern memory of the pattern generator 12.

Moreover, the reference signal setting section 340 can set a signal value which can be set to be enabled by the mask setting section 330 and whose corresponding strobe signal has the first or last phase as the reference signal value among signal values inputted to the changing point detecting section 310. For example, when glitch having a plurality of changing points of the value of the signal under measurement is detected in the previous test cycle (the first test cycle), the system control section 20 sets to the mask setting section 330 any changing point detecting section 310 to be enabled. The system control section 20 sets to the reference signal setting section 340 the first signal value or the last signal value among each signal value detected by the phase of the unmasked (enabled) strobe signal as a reference signal in the next test cycle (the second test cycle).

Here, the reference signal value outputted from the reference signal selecting section 350 may be a real signal value of the signal under measurement, and may be a pass/fail value outputted from a level comparator in accordance with the expected value among an H side of level comparator output or an L side of level comparator output outputted from the level detection section 375. The reference signal value indicates a signal value even if it is the pass/fail value.

The reference signal selecting section 350 selects any signal value among a plurality of signal values and outputs the selected one. Each output signal of the plurality of acquiring sections 300*a-e* and an output signal of the reference signal setting section 340 are inputted to the reference signal selecting section 350. The reference signal selecting section 350 selects the output signal from the acquiring section 300 set by the reference signal setting section 340 as a first-phase level signal 401 and outputs it to the pass/fail judgment unit 370. For example, when the reference signal setting section 340 sets the output of the first acquiring section 300*a* as the reference signal, the reference signal selecting section 350 selects the outputs of the first acquiring section 300*a* and outputs it as the first-phase level signal 401 to the pass/fail judgment unit 370. In the same way, when the reference signal setting section 340 sets the output of the second acquiring section 300*b* as a reference signal, the reference signal selecting section 350 selects the output of the second acquiring section 300*b* and outputs it as the first-phase level signal 401 to the pass/fail judgment unit 370. In the same way as described above, when the reference signal setting section 340 sets each of the outputs of the acquiring sections following the third acquiring section 300*c* as a reference signal, the reference signal selecting section 350 selects the output of the acquiring section and outputs it as the first-phase level signal 401 to the pass/fail judgment unit 370. Normally, each reference signal is set so as to indicate the head position within an enabled detecting interval set by the mask setting section 330 among the intervals of all the acquiring sections 300*a*-300*e*. Thereby it can be identified whether the signal under measurement is changed from the H level or the L level based on the H/L level of the first-phase level signal 401, so that it can be used as a condition for judging pass/fail.

The changing timing output section 360 outputs a timing at which the signal under measurement is changed based on the output of the changing point detecting section 310 to be enabled. The changing timing output section 360 may be a priority encoder, for example. Each output of the plurality of changing point masking sections 320*a-e* is inputted to the changing timing output section 360, and the changing timing output section 360 outputs to the pass/fail judgment unit 370 a changing point phase signal 402 indicative of any phase of strobe signal where a changing point of the value of the signal under measurement is detected and a glitch detection signal 403 indicating that there are a plurality of changing points based on the inputted each input.

The pass/fail judgment unit 370 judges that pass/fail of the device under test 200 based on the changing timing of the signal under measurement. The pass/fail judgment unit 370 receives the first-phase level signal 401 from the reference signal selecting section 350, the changing point phase signal 402 and the glitch detection signal 403 from the changing timing output section 360 and a plural of bits of expected value signals from the pattern generator 12 and outputs the first-phase level signal 401, the changing point phase signal 402, the glitch detection signal 403 and the pass/fail judgment result signal 501. In addition, the pass/fail judgment unit 370 can output the pass/fail judgment result signal 501 to the pattern generator 12, too and change the pattern outputted from the pattern generator 12 to a pattern for the next test. Here, a fail memory may be provided between the pass/fail judgment unit 370 and both of the reference signal selecting section 350 and the changing timing output section 360. In this case, outputs from the reference signal selecting section 350 and the changing timing output section 360 are written to the fail memory. The pass/fail judgment unit 370 may perform the above-described control by reading contents of the fail memory after testing or during testing. Here, in the configuration example of FIG. 2, a plurality of bits of expected value signal being capable of changing expected value data is received from the pattern generator 12 in real time. However, if real time is not required, an expected value register (not shown in the figure) is provided within the pass/fail judgment unit 370, so that judgment of pass/fail as described above may be performed.

As described above, the judgment section 16 according to the present embodiment can mask unnecessary changing points such as glitch by the plurality of changing point masking sections 320*a-e*, the mask setting section 330, the reference signal setting section 340 and the reference signal selecting section 350 in order to acquire the value of the signal under measurement corresponding to each strobe signal of the multi-strobe signal to obtain the changing point of the signal value. Moreover; the judgment section 16 according to the present embodiment can set as a reference value the head or the last detected signal value of the strobe signals other than the strobe signal to be masked. Therefore, even if the fluctuation margin of jitter is larger, the judgment section 16 according to the present embodiment can detect the changing point of the value of the signal under measurement by a set of multi-strobe signal. Moreover, the judgment section 16 according to the present embodiment can prevent any incorrect changing point other than the changing point to be detected from being detected by masking them even if a plurality of changing points of the value of the signal under measurement are detected.

FIGS. 3A and 3B show an exemplary relationship between a signal under measurement and strobe signals. In FIG. 3A, a DUT output is a signal under measurement which is inputted from the device under test 200 to the level detection section 375, for example. VOH is a threshold value in the level detection section 375 at a high potential side, and VOL is a threshold value in the level detection section 375 at a low potential side. For example, when an input voltage is changed from the low potential side to the high potential side, VOH at the high potential side may be used as a predetermined threshold value voltage. Meanwhile, when an input voltage is changed from the high potential side to the low potential side, VOL at the low potential side may be used as a predetermined threshold voltage. FIG. 3B shows a sixteen phases of multi-strobe signal, for example, and the front (the left edge) of strobe signal is a designated phase of strobe. In addition, the interval between each strobe is such as several tens of picoseconds which may be set significantly short for a test cycle.

FIGS. 4A-D show an exemplary relationship between signal under measurement and strobe signals with short intervals. FIG. 4A shows an exemplary case in which a DUT output has one changing point of the value of the signal under measurement in a test cycle. FIG. 4B shows an exemplary case in which any changing point of the value of the signal under measurement can not be detected because multi-strobe signal (A) each of which strobe signal has a short interval occurs and terminates before the changing point of the value of the signal under measurement of FIG. 4A in the test cycle. In this case, the test apparatus 100 changes the position of the initial phase of multi-strobe signal A toward the back in the test cycle and detects a changing point of the signal under measurement again.

FIG. 4C shows an exemplary case in which any changing point of the value of the signal under measurement can not be detected because multi-strobe signal (A) occurs and terminates still before the changing point of the value of the signal under measurement of FIG. 4A in the test cycle. In this case, the test apparatus 100 changes the position of the initial phase of multi-strobe signal A toward more back of the position of FIG. 4C in the test cycle and detects a changing point of the signal under measurement again. FIG. 4D shows an exemplary case in which the changing point of the value of the signal under measurement of FIG. 4A can be detected by multi-strobe signal (A). In this case, the test apparatus 100 does not change the position of the initial phase of multi-strobe signal (A) to detect the changing point of the value of the signal under measurement. The test apparatus can perform a test by utilizing the detected changing point of the value of the signal under measurement or judge the test result.

When there are the signal inputs as shown in FIGS. 3A and B, and FIGS. 4A to D, in the test apparatus using multi-strobe signal (A), the changing point of the value of the signal under measurement may not be detected by using one multi-strobe signal (A) because the number of phase of strobe signals is fixed, the time interval between each strobe signal is significantly short and a period for which the multi-strobe signal covers the test cycle period is short. In this case, the test apparatus changes the position of the initial phase of multi-strobe signal (A) within the test cycle period and repeats the detecting and processing the value or the like until the changing point of the value of the signal under measurement is found.

FIGS. 5A and B show an exemplary relationship between a signal under measurement and strobe signals with large intervals. FIG. 5A shows an exemplary case in which a DUT output has one changing point of the value of the signal under measurement within a test cycle. FIG. 5B shows an exemplary case in which the changing point of the value of the signal under measurement of FIG. 5A can be detected by multi-strobe signal B each of which strobe interval is extended in order to extend its area coverage in the test cycle. In this case, the test apparatus 100 may not change the position of the initial phase of multi-strobe signal B to detect the changing point of the value of the signal under measurement again. The test apparatus 100 can perform a test by utilizing the detected changing point of the value of the signal under measurement or judge the test result.

When there are the signal inputs as shown in FIGS. 5A and B, the test apparatus using multi-strobe signal (B) can extend the area coverage of a set of multi-strobe signal for the test cycle period by extending an interval between each phase of strobe signal of the multi-strobe signal, so that the changing point of the value of the signal under measurement can be detected.

FIGS. 6A to F show an exemplary relationship between a signal under measurement with jitter and strobe signals. FIG. 6A shows an exemplary case in which an extremely large jitter is generated at the changing point of the value of the signal under measurement of a DUT output. FIG. 6B shows an exemplary case to attempt to detect the changing point of the value of the signal under measurement with the large jitter as shown in FIG. 6A by multi-strobe signal (A). FIG. 6C shows an exemplary case in which the changing point of the value of the signal under measurement with the large jitter as shown in FIG. 6A is located at the front side of the jitter range. FIG. 6D shows an exemplary case in which the changing point of the value of the signal under measurement at the front side of the jitter range of FIG. 6C can not be detected by the front side of strobe signal of multi-strobe signal (A). FIG. 6E shows an exemplary case in which the changing point of the value of the signal under measurement with the large jitter as shown in FIG. 6A is located at the front side of the jitter range as well as FIG. 6C. FIG. 6F shows an exemplary case in which the changing point of the value of the signal under measurement as shown in FIG. 6A can be detected by multi-strobe signal (B).

When the fluctuation range of jitter is larger than the period range for all the number of phases of the multi-strobe signal in the test apparatus using multi-strobe signal (A) as shown in FIGS. 6A to D, sometimes the changing point of the value of the signal under measurement may not be detected for one test cycle. Therefore, the test apparatus 100 changes the position of the initial phase of the multi-strobe signal within the test cycle period and repeats the detecting and processing. Meanwhile, as shown in FIGS. 6E and F, the test apparatus using a set of multi-strobe signal (B) whose area coverage is extended by extending a time interval between each strobe signal can detect the changing point of the value of the signal under measurement by a set of multi-strobe signal even if the fluctuation range of jitter is larger.

FIGS. 7A to C show an exemplary relationship between a signal under measurement with jitter and glitch, and strobe signals. FIG. 7A shows an exemplary case in which jitter and glitch are generated at the changing points of the value of the signal under measurement of a DUT output. Here, the jitter of the anterior changing point which is not to be detected is large and the jitter of the posterior changing point which is to be detected is relatively small. FIG. 7B shows an exemplary case in which a target changing point of the value of the signal under measurement can be detected within the relatively small jitter at the posterior changing point of FIG. 7A by multi-strobe signal (A). FIG. 7C shows an exemplary case in which a changing point of the value of the signal under measurement to be detected can be detected within the relatively small jitter at the posterior changing point of FIG. 7A by multi-strobe signal (B) as well, however any changing point of the value of the signal under measurement within the large jitter at the anterior changing point of FIG. 7A which is not to be detected could be detected.

When multi-strobe signal (A) in a narrow range can be used at an appropriate timing as shown in FIGS. 7A and B, the test apparatus 100 can detect a changing point of the value of the signal under measurement to be detected. However, when multi-strobe signal (B) in a wide range is used as shown in FIGS. 7A and C, sometimes any incorrect changing point of the value of the signal under measurement other than the changing point of the value of the signal under measurement to be detected could be detected.

Each of FIGS. 8A to F shows an exemplary relationship between a signal under measurement having a changing point of its value and strobe signals. FIG. 8A shows an exemplary case in which there is one changing point of the value of the signal under measurement within a test cycle period, and the signal value of the front phase of strobe signal of multi-strobe signal B is a reference signal value which is judged as "pass". FIG. 8B shows an exemplary case in which there is one changing point of the value of the signal under measurement within a test cycle period, and the signal value of the front phase of strobe signal of multi-strobe signal (B) is the reference signal value which is judged as "fail". FIG. 8C shows there is no changing point of the value of the signal under measurement within a test cycle period, and the signal value of the front phase of strobe signal of multi-strobe signal (B) is judged as "pass". FIG. 8D shows an exemplary case in which there is no changing point of the signal value of the signal under measurement within a test cycle period, and the signal value of the front phase of strobe signal of multi-strobe signal (B) is the reference signal value which is judged as a reference signal value of "fail". FIG. 8E shows an exemplary case in which there are a plurality of changing points (glitches) of the value of the signal under measurement within a test cycle period and the signal value of the initial phase of strobe signal of multi-strobe signal (B) is the reference signal value which is judged as "pass". FIG. 8F shows an exemplary case in which there are plurality of changing points (glitches) of the value of the signal under measurements within a test cycle period and the signal value of the front phase of strobe signal of multi-strobe signal (B) is the reference signal value judged as "fail".

When there are signal inputs as shown in FIGS. 8A to D and multi-strobe signal (B) is used, the signal value of the front phase of strobe signal of multi-strobe signal (B) is the reference signal value in the test apparatus 100, for example. The test apparatus 100 can detect presence or absence of a changing point of the value of the signal under measurement in the subsequent phase of strobe signal to detect whether the changing point of the value of the signal under measurement is due to a change from "pass" to "fail" or vice versa. Then, the test apparatus 100 can perform a test by using the changing point or judge the test result. In addition, when there are signal inputs as shown in FIGS. 8E and F, and multi-strobe signal (B) is used, the test apparatus 100 detects glitch based on whether the number of changing point(s) of the value of the signal under measurement is one or more and notifies the behind control circuit of presence or absence of a changing point between the reference signal value and the value of the signal under measurement, and also presence or absence of glitch, for example. Thereby the test apparatus 100 can notify the rough waveform of the DUT output being the signal under measurement. That is, the test apparatus 100 described herein can notify the reference signal value, presence or absence of a changing point and the detection result of glitch to notify the rough waveform of the DUT output without transmitting all the result obtained by comparing the timing of the signal under measurement with that of the multi-strobe signal. However, when glitch is detected for the input of FIG. 8E or F, the test apparatus 100 using multi-strobe signal (B) sometimes may not detect the changing point to be detected. While on the other hand, the test apparatus 100 according to the present embodiment can detect only the changing point to be detected by masking the changing points other than the changing point to be detected even if there are the input as shown in FIG. 8E or F.

Figure 9:
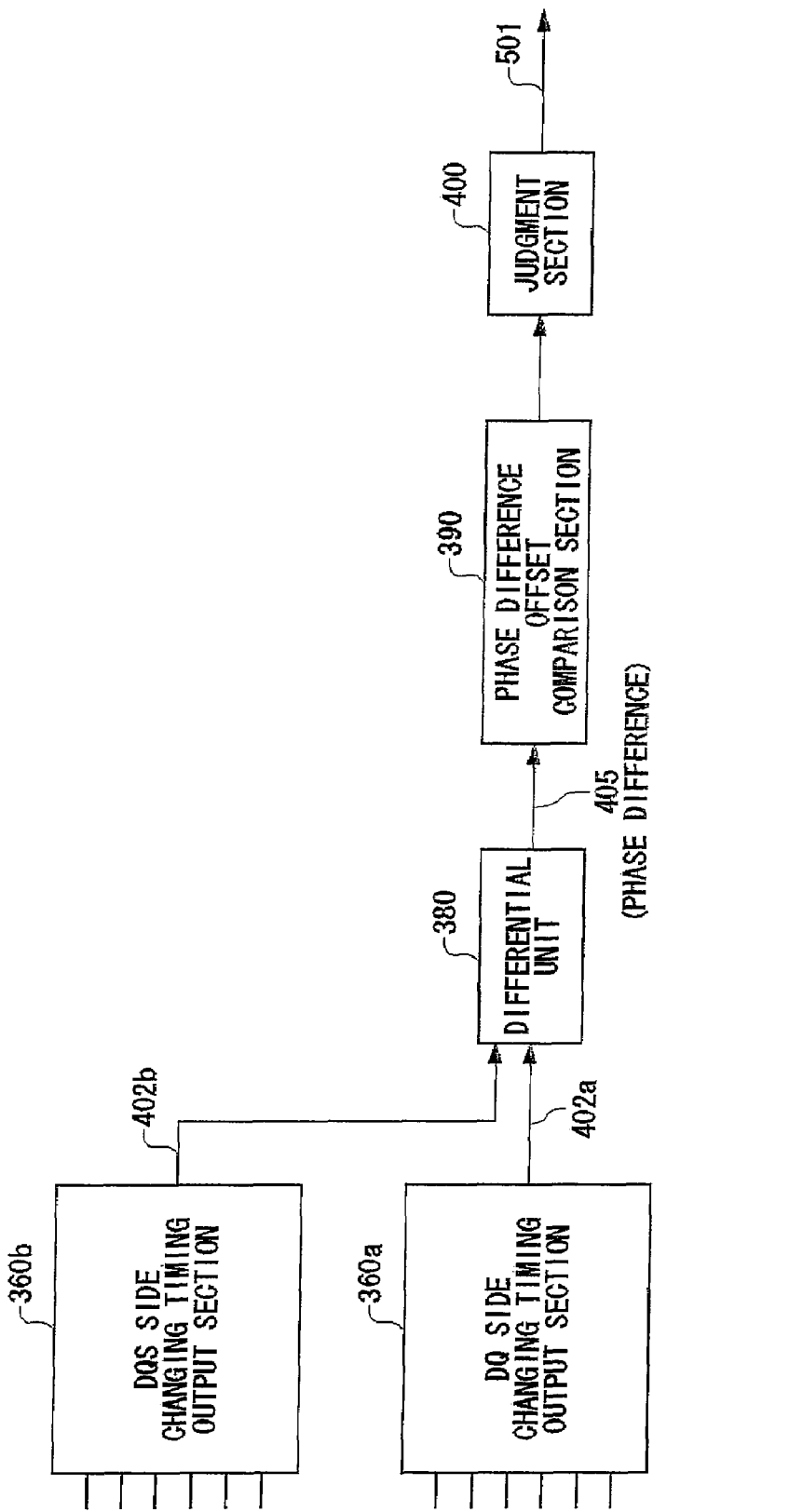
FIG. 9 shows an exemplary configuration of pass/fail judgment unit 370 according to the present embodiment.

FIG. 9 shows an exemplary internal configuration of the pass/fail judgment unit 370 according to the present embodiment. The DQ side changing timing output section 360a is basically the same as the changing timing output section 360 as shown in FIG. 2, here, signals to be inputted thereto are data (DQ) signals, the DQ side changing timing output section 360a outputs the phase of the changing point of the data (DQ) signal as a DQ side changing point phase signal 402a A DQS side changing timing output section 360b is also basically the same as the changing timing output section 360 as shown in FIG. 2, here signals to be inputted thereto are clock (DQS) signals, and the DQS side changing timing output section 360b outputs the phase of the changing point of the clock (DQS) signals as a DQS side changing point phase signal 402b. A differential unit 380 receives the DQS side changing point phase signal 402b and the DQ side changing point phase signal 402a, calculates the difference between the timings of both signals and outputs the result as a phase difference signal 405.

For example, a phase difference offset comparison section 390 compares an inputted phase difference signal 405 with a predefined offset range based on the specification of the test apparatus 100 and the device under test 200. That is, the phase difference offset comparison section 390 compares the phase difference between the clock signal and the signal under measurement with the specification and outputs the comparison result. When the phase difference between the clock signal and the signal under measurement is out of the specification, the judgment section 400 outputs "fail" as a pass/fail judgment result signal 501 to the system control section 20. Meanwhile, when the phase difference between the clock signal and the signal under measurement is within the specification, the judgment section 400 outputs "pass" as the pass/fail judgment result signal 501 to the system control section 20. In addition, when the phase difference between the clock signal and the signal under measurement is out of the specification and a retest is performed under a different condition, the judgment section 400 outputs "fail" to the system control section 20. Receiving the fail, the system control section 20 outputs a change of setting to the mask setting section 330 and the reference signal setting section 340. The system control section 20 performs a test according to the setting in the next test cycle.

Figure 10:
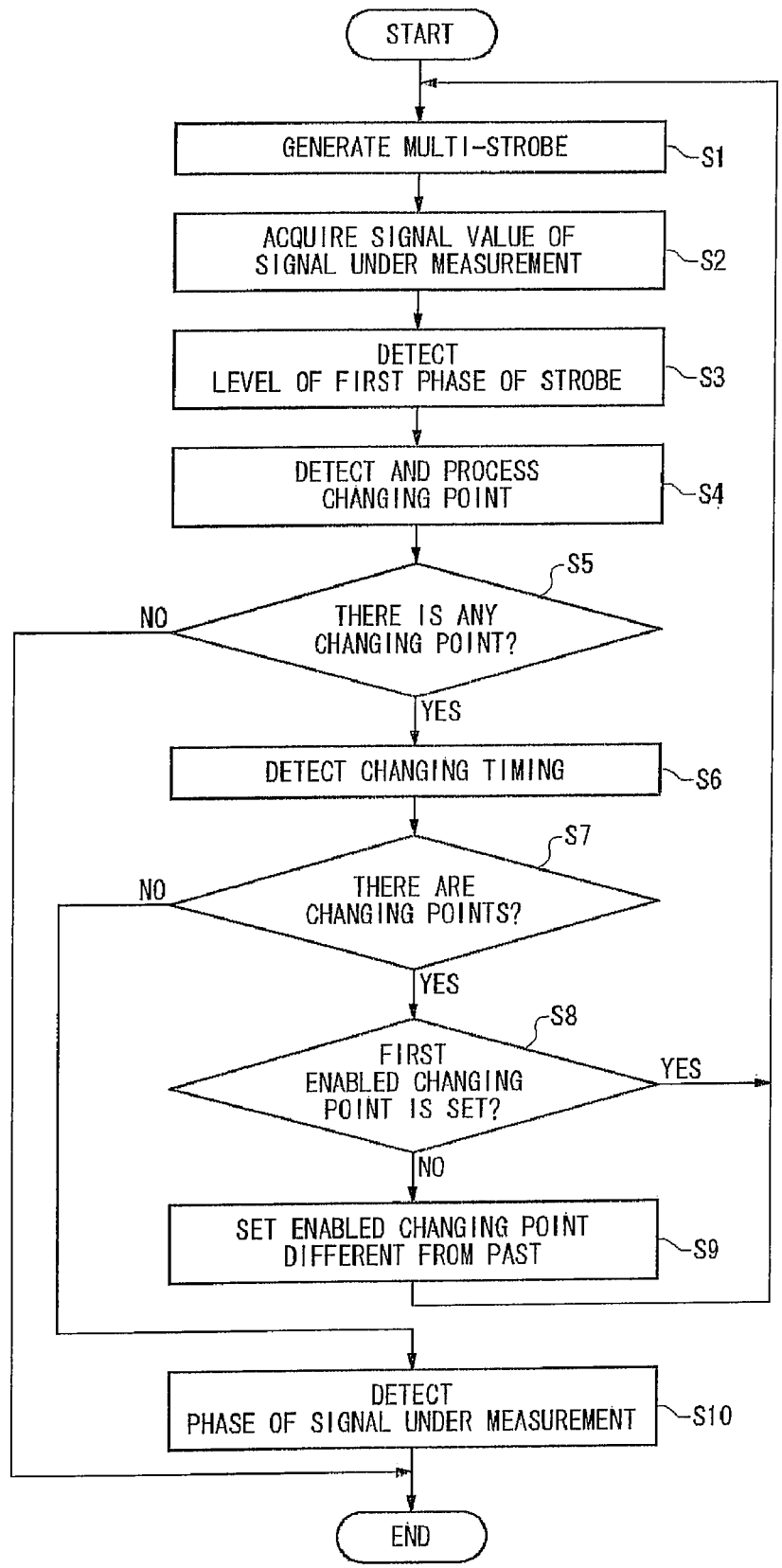
FIG. 10 shows a flowchart of schematic operation of the test apparatus 100 according to the present embodiment.

FIG. 10 shows a flowchart of schematic operation of the test apparatus 100 according to the present embodiment. The system control section 20 outputs multi-strobe signal (B) from the multi-strobe generating section 30 to the judgment circuit 34 in synchronism with a signal under measurement from the device under test 200 (S1) for a test pattern input. The level detection section 375 of the judgment circuit 34 acquires a digital signal value from an analog signal value of the signal under measurement and outputs the acquired value to the acquiring section 300 (S2). The acquiring section 300 outputs each signal value of the phase for each strobe signal of multi-strobe signal (B) to the changing point detecting section 310 and the reference signal selecting section 350.

According to a reference signal set by the reference signal setting section 340, the reference signal selecting section 350 selects the first phase of strobe signal to detect a change point to be detected and detects the signal value of the first phase of strobe signal from each signal value inputted. Then, the reference signal selecting section 350 outputs the detected result as the first-phase level signal 401 to the pass/fail judgment unit 370 and the system control section 20 (S3).

For example, when the number of changing point of the value of the signal under measurement is not known in the first test cycle, or when the number of changing point of the value of the signal under measurement in the first test cycle is one and no glitch is detected, the system control section 20 sets to the reference signal setting section 340 the signal value of the front (first) phase among each of the signal values detected by the acquiring section 300 as a reference signal in the next test cycle. In addition, when the expected value of the multi-strobe signal is inversed and used, the system control section 20 may set to the reference signal setting section 340 the signal value of the last phase as the reference signal in the next test cycle. As described above, the reference signal setting section 340 can set the phase for which a reference signal of the multi-strobe signal is obtained to the first phase of strobe signal or the last phase of strobe signal of the multi-strobe signal.

The changing point detecting section 310 detects a case that signal values corresponding to adjacent strobe signals among each of the signal values inputted from the acquiring section 300 are different from one another so as to detect the changing point and outputs a changing point detection signal (S4).

Specifically, since a setting for masking by the mask setting section 330 is not known in a first test cycle, the changing point masking section 320 may pass all the changing point detection signals.

The changing timing output section 360 firstly judges presence or absence of a changing point based on each changing point detection signal inputted from the changing point detecting section 310 through the changing point masking section 320 (S5). When there is any changing point, (S5: YES), the changing timing output section 360 detects a phase which includes that changing point based on the order of the strobe signal of the multi-strobe signal which is corresponding to that changing point, for example (S6). When there is no changing point (S5: NO), the test apparatus 100 ends the processing.

Next, the changing timing output section 360 judges whether there are a plurality of changing points based on the inputted changing point detection signal (S7). When there are a plurality of changing points (S7: YES), the changing timing output section 360 outputs the glitch detection signal 403 to the pass/fail judgment unit 370 and the system control section 20. Meanwhile, when there are not a plurality of changing points (S7: NO), the changing timing output section 360 detects the timing of the phase corresponding to one changing point of the signal under measurement, outputs the detected timing as the changing point phase signal 402 to the pass/fail judgment unit 370 and the system control section 20 and ends the processing (S10).

When the above described Step S S7 is Yes, the system control section 20 judges whether the setting to the mask setting section 330 is performed for the first time (S8). Here, what the setting to the mask setting section 330 is performed for the first time means that the setting to the mask setting section 330 is performed for the first time after the changing point detecting section 310 passes all the changing point detection signals in the first test cycle described above, for example. When it is for the first time (S8: YES), the system control section 20 sets to the mask setting section 330 an enabled changing point for the first time such that the front changing point is enabled and the other changing points are disabled, goes to the next second test cycle and returns to S1. In this case, specifically, the system control section 20 sets, as a setting for the enabled changing point for the first time, to the mask setting section 330 such that a mask is not applied before the signal value corresponding to the strobe signal for detecting the front changing point but is applied on the signal value corresponding to the subsequent strobe signals of the multi-strobe signal.

In addition, the system control section 20 selects and sets for the reference signal selecting section 350 the first phase of strobe signal for detecting a changing point to be detected within a range on which any mask is not applied. When setting is not performed for the first time (S8: NO), the system control section 20 sets to the mask setting section 330 an enabled changing point different from the past, and selects and sets for the reference signal selecting section 350 the first phase of strobe signal or detecting a changing point to be detected within a range on which any mask is not applied, goes to the next second test cycle and returns to S1 (S9). In this case, when the front changing point is an enabled changing point, for example, the system control section 20 may select the front strobe signal within a range on which any mask is not applied as the first phase of strobe signal to the mask setting section 330, for example.

Now, it will be described that a processing of Step S8 when glitch indicating there is a plurality of changing points of the value of the signal under measurement is detected in the first test cycle in the processing of Step S7. In this case, the system control section 20 sets to the mask setting section 330 such that the front changing point of the value of the signal under measurement is a changing point to be detected and the other changing points are masked, for example. Thereby the changing point masking section 320 masks the detected result of the changing point detecting section 310 by the strobe signals whose phases are other than that of the front changing point to be detected. Therefore, the system control section 20 and the mask setting section 330 can cause the changing point masking section 320 to output only the front changing point to be detected in the next test cycle.

In the above embodiment, a case has been described that the setting of the mask setting section 330 for the second test cycle is executed when a plurality of changing points are detected due to a setting such that the mask setting section 330 passes all the changing point detection signals in the first test cycle under the setting that the mask setting section 330 passes all the changing point detecting signal. However, when an enabled changing point detecting section 310 is previously set in the mask setting section 330 and a plurality of changing points are detected, the changing point detection signal to be detected may be obtained in the first test cycle.

Figure 11:
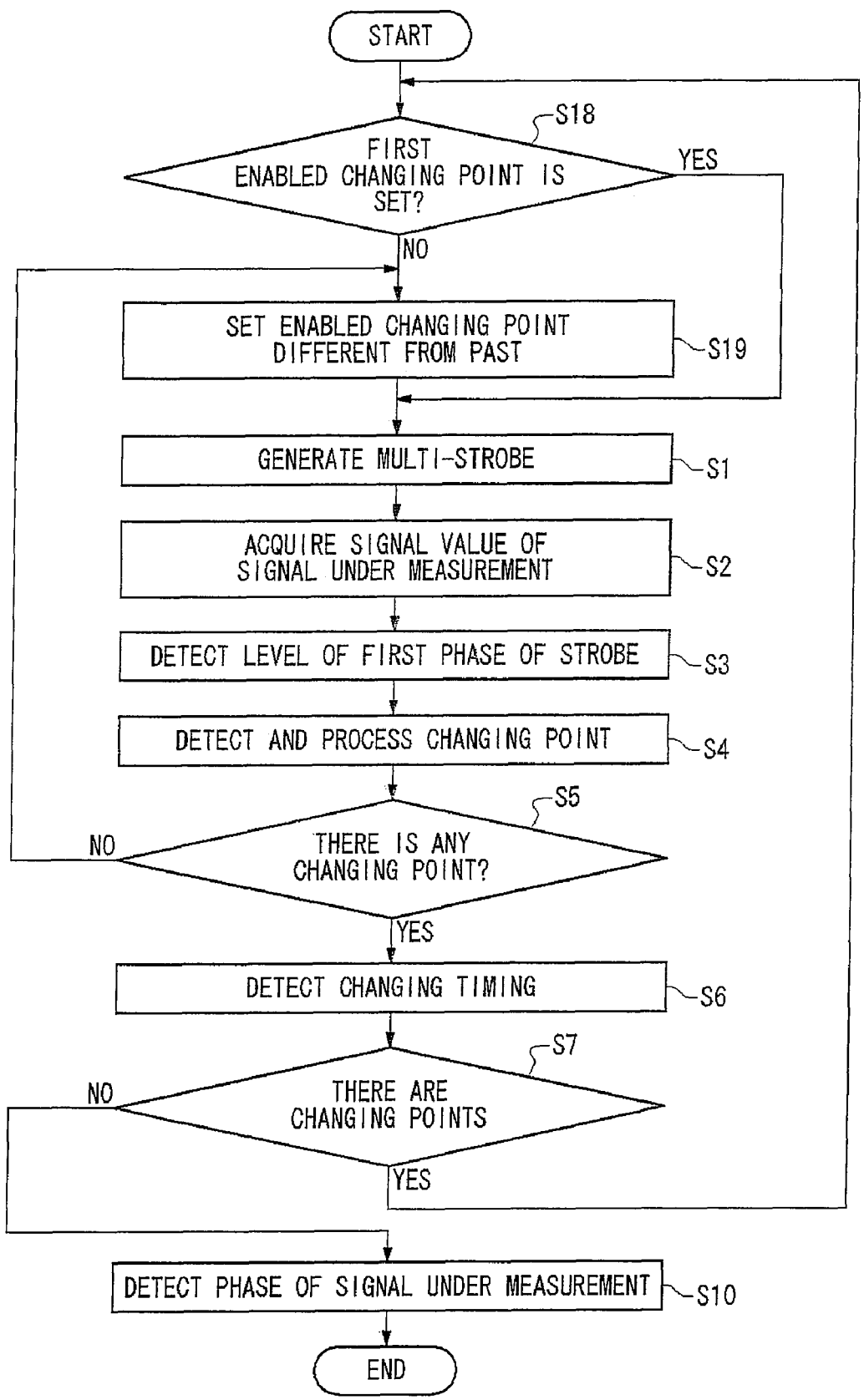
FIG. 11 shows a flowchart of a schematic operation of a modification of the test apparatus 100 according to the present embodiment.

FIG. 11 is a flowchart of a schematic operation of a modification of the test apparatus 100 according to the present embodiment. In the flowchart of FIG. 11, Step S18 is a process for judging whether a setting for the mask setting section 330 is performed for the first time as well as Step S8 of FIG. 10. Then, Step S19 is a process the same as Step S9 of FIG. 10. However, the present modification is different from the embodiment of FIG. 10 to the extent that those processes are fly executed among the processes of each test cycle. When the setting for the mask setting section 330 is performed for the first time (S18: YES), the system control section 20 sets the first setting previously set for the mask setting section 330 and goes to Step S1. When the setting for the mask setting section 330 is not performed for the first time (S18: NO), the system control section 20 sets an enabled changing point different from the past in Step S19 and goes to Step S1. The contents of processes from Step S1 to Step S7 and Step S10 are the same as those of FIG. 10. However, it is different from the case of FIG. 10 to the extent that the process does not end and returns to Step S19, and an enabled changing point different from the past is set when Step S5 is NO.

The mask setting section 330 as shown in FIG. 11 enables two or more changing point detecting sections 310 which receive two or more signal values acquired in accordance with two or more adjacent strobe signals among a plurality of changing point detecting sections 310a-e in the first test cycle. Then, the changing timing output section 360 detects a changing timing of the value of the signal under measurement with respect to the first group including two or more changing point detecting sections 310 enabled by the mask setting section 330. The two or more signal values acquired in accordance with the adjacent two or more strobe signals may mean signal values which are outputted from the first acquiring section 300a to the third acquiring section 300c adjacent to one another as shown in FIG. 2, for example. Moreover, when the signal values are outputted from the first acquiring section 300a to the third acquiring section 300c, the two or more changing point detecting sections 310 may mean means the changing point detecting sections 310a-c corresponding to the signal values outputted from the first acquiring section 300a to the third acquiring section 300c, for example. In this case, the changing point detecting sections 310a-c may be the first group.

Moreover, the mask setting section 330 as shown in FIG. 11 enables two or more changing point detecting sections 310 different from the first group which receives two or more signal values acquired in accordance with two or more adjacent strobe signals among the plurality of changing point detecting sections 310a-e in the next second test cycle. Then, the changing timing output section 360 detects a changing timing of the signal under measurement with respect to the second group including two or more changing point detecting sections 310 enabled by the mask setting section 330 in the second test cycle. The two or more changing point detecting sections 310 different from the first group may be the changing point detecting sections 310d-e in contraposition to the changing point detecting sections 310a-c of the first test cycle. In this case, the fourth changing point detecting sections 310d-e may be the second group.

In addition, when the changing timing output section 360 detects glitch in response to a fact that the enabled two or more changing point detecting sections 310 detect two or more changing points, the system control section 20 narrows a range of the changing point detecting sections 310 to be enabled with respect to a setting value set to the mask setting section 330. The system control section 20 performs said processing in response to detecting glitch by the changing timing output section 360. For example, detection signals of the detecting points corresponding to the front strobe signal to the sixth strobe signal of multi-strobe (B) as shown in FIG. 7C are set to the mask setting section 330 by the system control section 20. Then, a range for enabled changing point detecting sections 310 becomes narrower. Thereby the system control section 20 and the mask setting section 330 can cause the changing point masking section 320 to easily output a changing point to be detected in the next test cycle.

In addition, when glitch is detected and, for example, when any changing point which is not to be detected is detected behind the changing point to be detected, the system control section 20 sets the mask setting section 330 in response to facts that the reference signal value is matched with the expected value in the pass/fail judgment unit 370 and that the changing timing output section 360 detects glitch. The system control section 20 sets the mask setting section 330 such that the changing point detecting section 310 which receives the changed signal value is disabled when the reference signal value is indicative of a signal value before changing the signal under measurement, and such that the changing point detecting section 310 which receives the unchanged signal value is disabled when the reference signal value is indicative of a signal value after changing the signal under measurement. For example, when the front rising edge is a changing point to be detected in the left side of FIG. 8E and when a signal value corresponding to the front strobe signal ST1 is a reference signal value corresponding to the expected value, the system control section 20 sets the mask setting section 330 such that the changing point detecting sections 310 corresponding to all strobe signals following strobe signal STn+1 in the left side of FIG. 8E are disabled. In addition, when the signal value is affected by jitter, the system control section 20 may set the mask setting section 330 such that a strobe signal behind strobe signal STn+1 by a predetermined number of strobe signals is designated so as to cancel the effect of jitter and the changing point detecting sections 310 corresponding to the subsequent strobe signals are disabled. Thereby the system control section 20 and the mask setting section 330 also can cause the changing point masking section 320 to easily output a changing point to be detected in the next test cycle.

Moreover, when glitch is detected and, for example, when any changing point which is not to be detected is detected before the changing point to be detected, the system control section 20 sets the mask setting section 330 in response to facts that the reference signal value is different from the expected value and that the changing timing output section 360 detects glitch. The system control section 20 sets the mask setting section 330 such that the changing point detecting section 310 which receives the unchanged signal value is disabled when the reference signal value is indicative of the signal value before changing the signal under measurement, and such that the chancing point detecting section 310 which receives the changed signal value is disabled when the reference signal value is indicative of the signal value after changing the signal under measurement. For example, when the rising edge following a Step S STSn+1 is a changing point to be detected in the left side of FIG. 8F and when a signal value corresponding to the front changed strobe signal STn+1 is a reference signal value not corresponding to the expected value, the system control section 20 sets the mask setting section 330 such that the changing point detecting sections 310 corresponding to all strobe signals before strobe signal STn+1 are disabled in the left side of FIG. 8F. In the same way, when the signal value is affected by jitter, the system control section 20 may set the mask setting section 330 such that a strobe signal before strobe signal STn+1 by a predetermined number of strobe signals is designated so as to cancel the effect of jitter and the changing point detecting sections 310 corresponding to the strobe signals before the designated one are disabled, for example. Thereby the system control section 20 and the mask setting section 330 also can cause the changing point masking section 320 to easily output a changing point to be detected in the next test cycle.

As described above, when glitch is detected, the test apparatus 100 according to the present embodiment detects the changing timing by using a plurality of groups including two or more changing point detecting sections 310 which are enabled by the mask setting section 330 for each of a plurality of test cycles, for example. In this case, when a changing timing is detected in any of the groups in the test apparatus 100, the changing timing of the signal under measurement will be the detected changing timing.

Figure 12:
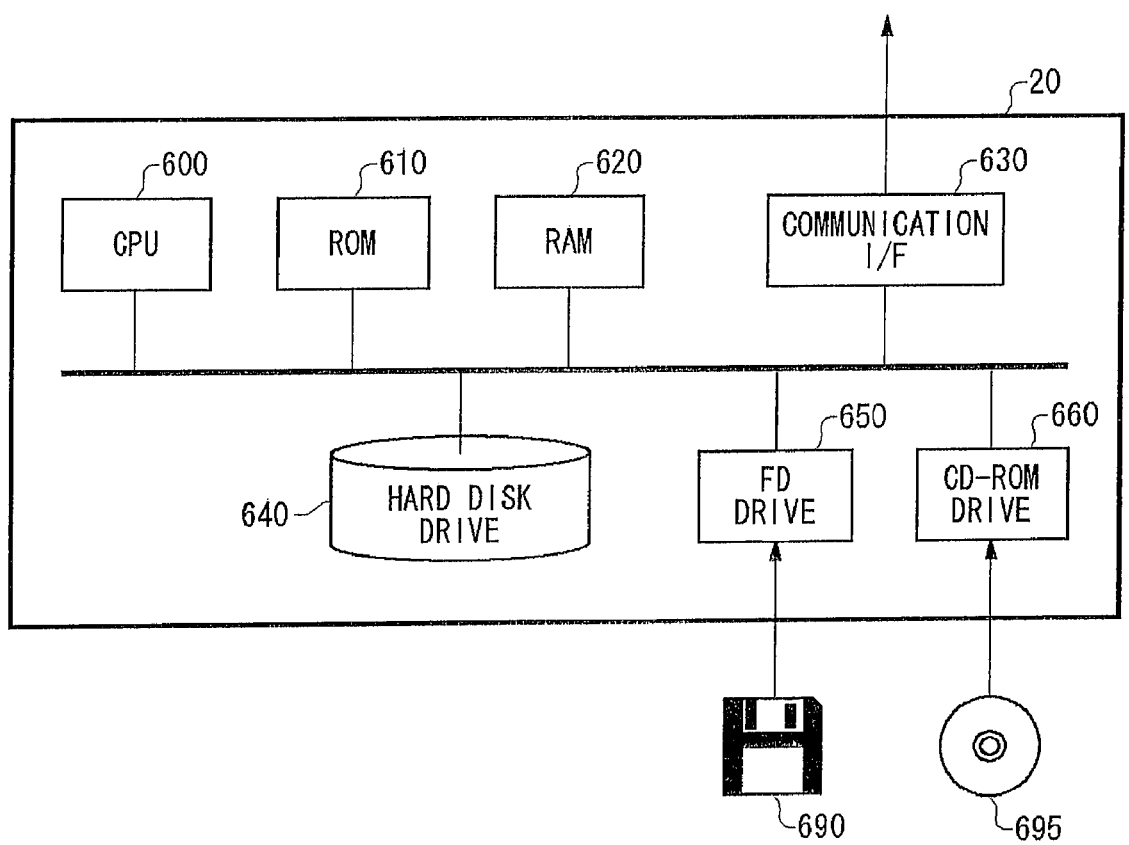
FIG. 12 shows an exemplary hardware configuration of a system control section 20 according to the present embodiment.

FIG. 12 shows an exemplary hardware configuration of the system control section 20 according to the present embodiment. The system control section 20 according to the present embodiment includes a CPU 600, a ROM 610, a RAM 620, a communication interface 630, a hard disk drive 640, a flexible disk drive 650 and a CD-ROM drive 660.

The CPU 600 operates according to programs stored in the ROM 610 and the RAM 620 and controls each section. The ROM 610 stores thereon a boot program executed by the CPU 600 at activating the system control section 20 or a program dependent on the hardware of the system control section 20 or the like. The RAM 620 stores thereon the program, data and so forth used by the CPU 600. The communication interface 630 communicates with the other components through a bus and also communicates with the other devices through a communication network. The hard disk drive 640 stores therein the program and data used by the system control section 20 and provides them to the CPU through the RAM 620. The flexible disk drive 650 reads the program or data from the flexible disk 690 and provides them to the RAM 620. The CD-ROM drive 660 reads the program or data from the CD-ROM 695 and provides them to the RAM 620.

The program provided to the CPU 600 through the RAM 620 is stored on a recording medium such as the flexible disk 690, the CD-ROM 695, the IC card or the like and provided by a user. The program reads from a recording medium installed onto the system control section 20 through the RAM 620 and executed by the system control section 20.

The program installed onto the system control section 20 and executed to control functions of the test apparatus 100 includes contents for controlling the timing generator 10, the pattern generator 12, the waveform shaper 14, the multi-strobe generating section 30 and the judgment circuit 34 to cause the test apparatus 100 to perform the above described operations.

The program described above may be stored on an outside recording medium. The recording medium can include an optical recording medium such as a DVD or a PD, a magneto-optical recording medium such as an MD, a tape medium, a semiconductor memory such as an IC card, and so on, in addition to the flexible disk 690 and the CD-ROM 695. Moreover, a storage device such as a hard disk or the RAM provided in a server system connected to a private communication network or Internet may be used as a recording medium, and a program may be provided to the system control section 20 from an outside network via a communication network.

While the aspects of the invention been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

As apparent from the above descriptions, according to an embodiment of the present invention, it is possible to detect the changing point of the value of the signal under measurement by a set of multi-strobe signal even if the fluctuation range of jitter is large. Moreover, it is possible to provide a detection apparatus and a test apparatus being capable of preventing any incorrect changing point other than the changing point to be detected from being detected by masking it even if a plurality of changing points of the value of the signal under measurement are detected.

What is claimed is:

1. A detection apparatus comprising:
a multi-strobe generating section that generates a plurality of strobe signals with phases different from one another;
a plurality of acquiring sections each of which acquires a signal value of a signal under measurement at a timing of a corresponding strobe signal;
a plurality of changing point detecting sections each of which receives the signal value of the signal under measurement from one of the acquiring sections at the timing of the corresponding strobe signal and the signal value of the signal under measurement from another of the acquiring sections at the timing of an adjacent strobe signal and detects a changing point of the signal under measurement between the two adjacent strobe signals when the two received signal values are different from one another;
a mask setting section that enables at least one of the plurality of changing point detecting sections and disables at least one of the plurality of changing point detection sections, the output of the disabled changing point detection sections being masked;
a changing timing output section that outputs a changing timing of the signal under measurement based on an output of the enabled changing point detecting sections;
a reference signal setting section that sets which signal value among a plurality of signal values acquired by the plurality of acquiring sections is a reference signal value indicative of a value before or after the signal under measurement changes; and
a reference signal selecting section that selects the reference signal value among the plurality of signal values and outputs the selected reference signal value, wherein
the changing timing output section detects a glitch in response to two or more changing point detecting sections that are enabled by the mask setting section detecting two or more changing points, and the mask setting section narrows a range of the enabled changing point detecting sections in response to the changing timing output section detecting the glitch.

2. The detection apparatus as set forth in claim 1, wherein the reference signal setting section sets as the reference signal value a signal value at a timing of a first or a last phase of the plurality of strobe signals inputted to the at least one changing point detecting section enabled by the mask setting section.

3. The detection apparatus as set forth in claim 1, wherein
in a first test cycle, the mask setting section enables two or more of the changing point detecting sections that receive signal values acquired in accordance with adjacent strobe signals,
the changing timing output section detects a changing timing of the signal under measurement with respect to a first group including the two or more of the changing point detecting sections which are enabled by the mask setting section in the first test cycle,
in a second test cycle, the mask setting section enables two or more of the changing point detecting sections which are different from the two or more of the changing point detecting sections included in the first group and receive signal values acquired in accordance with adjacent strobe signals, and
the changing timing output section detects a changing timing of the signal under measurement with respect to a second group including the two or more of the changing point detecting sections which are enabled by the mask setting section in the second test cycle.

4. The detection apparatus as set forth in claim 1, wherein, in response to the reference signal value being matched with an expected value and the changing timing output section detecting the glitch, the mask setting section disables the changing point detecting section that receives a changed signal value when the reference signal value is indicative of a value before the signal under measurement changes and disables the changing point detecting section that receives an unchanged signal value when the reference signal value is indicative of a value after the signal under measurement changes.

5. The detection apparatus as set forth in claim 1, wherein, in response to the reference signal value being different from an expected value and the changing timing output section detecting the glitch, the mask setting section disables the changing point detecting section that receives an unchanged signal value when the reference signal value is indicative of a value before the signal under measurement changes and disables the changing point detecting section that receives a changed signal value when the reference signal value is indicative of a value after the signal under measurement changes.

6. The detection apparatus as set forth in claim 1, further comprising:
a plurality of changing point masking sections each of which receives the changing point detected by one of the plurality of changing point detecting sections and either outputs the detected changing point or masks the detected changing point depending on one of a plurality of mask signals,
wherein the mask setting section enables the at least one of the plurality of changing point detecting sections and disables the at least one of the plurality of changing point detection sections by supplying the plurality of changing point masking sections with the plurality of mask signals, and the changing timing output section outputs the changing timing of the signal under measurement based on the output of the enabled changing point detecting sections output from the plurality of changing point masking sections.

7. A test apparatus that tests a device under test, comprising:
a test signal supply section that supplies a test signal to the device under test; and
a judgment section that judges pass/fail of the device under test based on a signal under measurement outputted by the device under test in accordance with the test signal, the judgment section including:
a multi-strobe generating section that generates a plurality of strobe signals with phases different from one another;
a plurality of acquiring sections each of which acquires a signal value of the signal under measurement at a timing of a corresponding strobe signal;
a plurality of changing point detecting sections each of which receives the signal value of the signal under measurement from one of the acquiring sections at the timing of the corresponding strobe signal and the signal value of the signal under measurement from another of the acquiring sections at the timing of an adjacent strobe signal and detects a changing point of the signal under measurement between the two adjacent strobe signals when the two received signal values are different from one another;
a mask setting section that enables at least one of the plurality of changing point detecting sections and disables at least one of the plurality of changing point detection sections, the output of the disabled changing point detection sections being masked;
a changing timing output section that outputs a changing timing of the signal under measurement based on an output of the enabled changing point detecting sections;
a pass/fail judgment unit that judges pass/fail of the device under test based on a changing timing of the signal under measurement;
a reference signal setting section that sets which signal value among a plurality of signal values acquired by the plurality of acquiring sections is a reference signal value indicative of a value before or after the signal under measurement changes; and
a reference signal selecting section that selects the reference signal value among the plurality of signal values and outputs the selected reference signal value, wherein
the changing timing output section detects a glitch in response to two or more changing point detecting sections that are enabled by the mask setting section detecting two or more changing points, and
the mask setting section narrows a range of the enabled changing point detecting sections in response to the changing timing output section detecting the glitch.

8. The test apparatus as set forth in claim 7, wherein the reference signal setting section sets as the reference signal value a signal value at a timing of a first or a last phase of the plurality of strobe signals inputted to the at least one changing point detecting section enabled by the mask setting section.

9. The detection apparatus as set forth in claim 7, wherein
in a first test cycle, the mask setting section enables two or more of the changing point detecting sections that receive signal values acquired in accordance with adjacent strobe signals,
the changing timing output section detects a changing timing of the signal under measurement with respect to a first group including the two or more of the changing point detecting sections which are enabled by the mask setting section in the first test cycle, in a second test cycle, the mask setting section enables two or more of the changing point detecting sections which are different from the two or more of the changing point detecting sections included in the first group and receive signal values acquired in accordance with adjacent strobe signals, and the changing timing output section detects a changing timing of the signal under measurement with respect to a second group including the two or more of the changing point detecting sections which are enabled by the mask setting section in the second test cycle.

10. The test apparatus as set forth in claim 7, wherein, in response to the reference signal value being matched with an expected value and the changing timing output section detecting the glitch, the mask setting section disables the changing point detecting section that receives a changed signal value when the reference signal value is indicative of a value before the signal under measurement changes and disables the changing point detecting section that receives an unchanged signal value when the reference signal value is indicative of a value after the signal under measurement changes.

11. The test apparatus as set forth in claim 7, wherein, in response to the reference signal value being different from an expected value and the changing timing output section detecting the glitch, the mask setting section disables the changing point detecting section that receives an unchanged signal value when the reference signal value is indicative of a value before the signal under measurement changes and disables the changing point detecting section that receives a changed signal value when the reference signal value is indicative of a value after the signal under measurement changes.

12. The test apparatus as set forth in claim 7, further comprising:

a plurality of changing point masking sections each of which receives the changing point detected by one of the plurality of changing point detecting sections and either outputs the detected changing point or masks the detected changing point depending on one of a plurality of mask signals, wherein the mask setting section enables the at least one of the plurality of changing point detecting sections and disables the at least one of the plurality of changing point detection sections by supplying the plurality of changing point masking sections with the plurality of mask signals, and the changing timing output section outputs the changing timing of the signal under measurement based on the output of the enabled changing point detecting sections output from the plurality of changing point masking sections.

13. A detection apparatus comprising:

a multi-strobe generating section that generates a plurality of strobe signals with phases different from one another at whose timings signal values of a signal under measurement are acquired;

a plurality of changing point detecting sections each of which receives a signal value of the signal under measurement at the timing of one of the plurality of strobe signals and the signal value of the signal under measurement at the timing of an adjacent one of the plurality of strobe signals and detects a changing point of the signal under measurement between the two adjacent strobe signals when the two received signal values are different from one another;

a mask setting section that enables at least one of the plurality of changing point detecting sections and disables at least one of the plurality of changing point detection sections, the output of the disabled changing point detection sections being masked; and a changing timing output section that detects a glitch in response to two or more changing point detecting sections that are enabled by the mask setting section detecting two or more changing points, wherein the mask setting section narrows a range of the enabled changing point detecting sections in response to the changing timing output section detecting the glitch.

14. The detection apparatus as set forth in claim 13, further comprising:

a plurality of changing point masking sections each of which receives the changing point detected by one of the plurality of changing point detecting sections and either outputs the detected changing point or masks the detected changing point depending on one of a plurality of mask signals, wherein the mask setting section enables the at least one of the plurality of changing point detecting sections and disables the at least one of the plurality of changing point detection sections by supplying the plurality of changing point masking sections with the plurality of mask signals.

* * * * *